United States Patent
Petrillo et al.

(10) Patent No.: US 12,087,601 B2
(45) Date of Patent: Sep. 10, 2024

(54) REDUCING LINE EDGE ROUGHNESS AND MITIGATING DEFECTS BY WAFER FREEZING

(71) Applicant: International Business Machines Corporation, Armonk, NY (US)

(72) Inventors: Karen E. Petrillo, Voorheesville, NY (US); Jennifer Fullam, Clifton Park, NY (US); Yongan Xu, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 816 days.

(21) Appl. No.: 16/406,657

(22) Filed: May 8, 2019

(65) Prior Publication Data
US 2020/0357666 A1    Nov. 12, 2020

(51) Int. Cl.
*H01L 21/67* (2006.01)
*G03F 7/40* (2006.01)

(52) U.S. Cl.
CPC ......... *H01L 21/67248* (2013.01); *G03F 7/40* (2013.01); *H01L 21/67098* (2013.01); *H01L 21/67225* (2013.01)

(58) Field of Classification Search
CPC ......... H01L 21/67248; H01L 21/67098; H01L 21/67225; H01L 21/67109; H01L 21/6715; H01L 21/67103; G03F 7/40
See application file for complete search history.

(56) References Cited

U.S. PATENT DOCUMENTS

| | | | |
|---|---|---|---|
| 6,716,570 B2 | 4/2004 | Nagarajan et al. | |
| 8,852,964 B2 | 10/2014 | Kimura et al. | |
| 9,520,298 B2* | 12/2016 | De Schepper | ...... H01L 21/3086 |
| 2007/0251456 A1 | 11/2007 | Herchen et al. | |
| 2008/0099181 A1 | 5/2008 | Ramanan et al. | |
| 2015/0228497 A1* | 8/2015 | De Schepper | ...... H01L 21/3086 |
| | | | 438/694 |
| 2016/0279679 A1* | 9/2016 | Kitagawa | .................. B08B 3/10 |
| 2016/0306280 A1 | 10/2016 | Fakhr et al. | |
| 2019/0229258 A1* | 7/2019 | Garten | ............ H10N 30/10513 |
| 2019/0348306 A1* | 11/2019 | Koltonski | ......... H01L 21/67069 |
| 2019/0355597 A1* | 11/2019 | Mochizuki | .............. C23C 16/46 |
| 2019/0369175 A1* | 12/2019 | Schwartz | ................ B01J 27/20 |

OTHER PUBLICATIONS

Hu et al., "Sub-10 nm electron beam lithography using cold development of poly (methylmethacrylate)," Journal of Vacuum Science & Technology B, vol. 22, No. 4, 2004, pp. 1711-1716.

(Continued)

*Primary Examiner* — Edward Chin
(74) *Attorney, Agent, or Firm* — Joseph P. Curcuru; Otterstedt & Kammer PLLC

(57) ABSTRACT

A photoresist is developed on a semiconductor wafer. The wafer is introduced into a controlled cold temperature environment and is maintained there until inelastic thermal contraction of the developed photoresist material results in reducing the critical dimension (CD) of the photoresist by not less than 10% from its value before exposure to the controlled cold temperature environment. Then the semiconductor wafer is removed from the controlled cold temperature environment.

3 Claims, 4 Drawing Sheets

(56) References Cited

OTHER PUBLICATIONS

Chang et al., "A comprehensive model for sub-10 nm electron-beam patterning through the short-time and cold development," Nanotechnology, vol. 28, No. 42, 2017, 425301, 9 pp.
Staaks et al., "Low temperature dry etching of chromium towards control at sub-5 nm dimensions," Nanotechnology, vol. 27, No. 41, 2016, 415302, 10 pp.
Schuppert et al., "Anisotropic plasma etching of polymers using a cryo-cooled resist mask," Journal of Vacuum Science & Technology A, vol. 18, No. 2, 2000, pp. 385-387.

* cited by examiner

REDUCING LINE EDGE ROUGHNESS AND MITIGATING DEFECTS BY WAFER FREEZING

BACKGROUND

The present invention relates to the electrical, electronic, and computer arts, and more specifically, to semiconductor device manufacturing processes that include e-beam lithography or photolithography.

In lithography of semiconductor devices, it is known that variations in the soft or hard mask material can introduce line edge roughness (LER) or line width roughness (LWR) that limits the minimum achievable feature size. The International Technology Roadmap for Semiconductors (ITRS) requires continually diminishing feature sizes that exceed the minimums presently achievable by lithography.

SUMMARY

Principles of the invention provide techniques for reducing line edge roughness and mitigating defects by wafer freezing. In one aspect, an exemplary method includes developing a photoresist on a semiconductor wafer; introducing the semiconductor wafer into a controlled cold temperature environment; maintaining the semiconductor wafer in the controlled cold temperature environment until inelastic thermal contraction of the developed photoresist material results in reducing the critical dimension (CD) of the photoresist by not less than 10% from its value before exposure to the controlled cold temperature environment; and removing the semiconductor wafer from the controlled cold temperature environment.

According to another aspect, on a semiconductor wafer that has been treated with developed photoresist and that has been exposed to a controlled cold temperature environment, the developed photoresist has line edge roughness and line width roughness that are at least 10% less than the corresponding critical dimensions of a semiconductor wafer with the same composition of photoresist developed in the same way that has not been exposed to a controlled cold temperature environment.

In another aspect, an exemplary apparatus includes a semiconductor wafer that is patterned with a developed photoresist, and a chiller chamber that is maintained at a controlled cold temperature between −196° C. and 5° C. The semiconductor wafer is disposed within the chiller chamber.

In view of the foregoing, techniques of the present invention can provide substantial beneficial technical effects. For example, one or more embodiments provide one or more of:

Reduced line edge roughness during the treatment of photoresist images under controlled cold temperature environment.

Reduced line width roughness during the treatment of photoresist images under controlled cold temperature environment.

Improved quality of photoresist images during the lithography step.

These and other features and advantages of the present invention will become apparent from the following detailed description of illustrative embodiments thereof, which is to be read in connection with the accompanying drawings.

DETAILED DESCRIPTION

Workers in the relevant art appreciate that LER in extreme ultraviolet and e-beam lithography is large by comparison to the ITRS specifications, making LER a yield detractor in semiconductor manufacturing processes. Multiple solutions are available such as application of surfactenated rinse materials (i.e. rinse materials incorporating a surfactant), ion implantation, overcoating, and track-based smoothing.

Current smoothing processes introduce the post lithography wafer to environments at room temperature or higher. By contrast, in one or more embodiments of the invention post lithography processing is carried out at controlled temperatures colder than room temperature. Surprisingly, the controlled cold temperatures result in reduced LER and LWR after treatment of the resist features, enabling resolution of smaller lines without line breaks or line flopover. It is believed the reduction in LER and LWR is caused by inelastic thermal contraction of the developed photoresist material, which results in reducing the critical dimension (CD) of the features.

In one or more embodiments, controlled cold temperatures can be achieved and maintained by submerging the wafer in a cold fluid that has a temperature in the range of about −196° C. (e.g., liquid nitrogen) to about 5° C. (e.g., refrigerated air). In one or more embodiments, controlled cold temperatures can be achieved by placing the wafer into a chiller chamber or a freezer chamber, maintained at a temperature in the range of about −78° C. to about 0° C. Generally, a minimum value for the controlled cold temperature is −196° C. and a maximum value for the controlled cold temperature is 5° C.

In one or more embodiments, the chiller chamber or the freezer chamber can be a module that attaches to a clean track. In one or more embodiments, the chiller chamber or the freezer chamber can be a standalone module also used for wafer storage or as a wafer rack.

In one or more embodiments, satisfactory results can be achieved by maintaining the wafer within a controlled cold temperature range for at least 60 seconds or until thermal equilibrium is achieved. In one or more embodiments, the wafer is held within the controlled cold temperature range for at least 48 hours. In one or more embodiments, satisfactory results can be achieved by maintaining the wafer within the controlled cold temperature range for not more than 48 hours. In one or more embodiments, the wafer is held within the controlled cold temperature range for no more than six hours.

In one or more embodiments, relative humidity surrounding the wafer is maintained between about 30% and about 60% while the wafer is maintained within the controlled cold temperature range.

Figure 1:
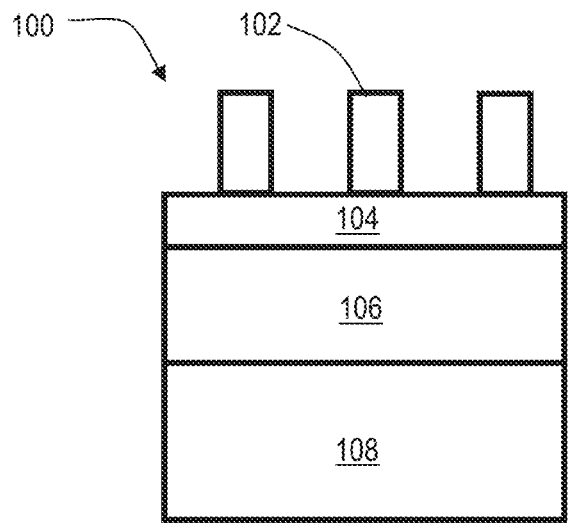
FIG. 1 depicts in a schematic view a semiconductor wafer following a lithography step in wafer manufacturing.

Thus, FIG. 1 depicts in a schematic view a semiconductor wafer 100 patterned with developed photoresist material 102. The semiconductor wafer also includes a bottom anti-reflective coating (BARC) or underlayer 104, an organic planarization layer (OPL) 106, and a substrate 108. In one or more embodiments, the BARC is also a hard mask.

Figure 2:
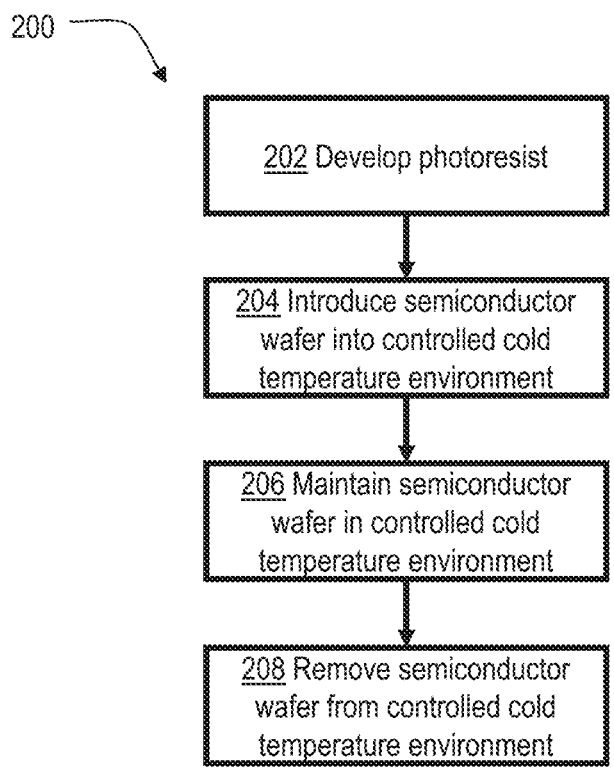
FIG. 2 depicts in a flowchart steps of a method for reducing line edge roughness and line width roughness of the semiconductor wafer, according to an exemplary embodiment.

FIG. 2 depicts in a flowchart method steps of a method 200 for post lithography processing of a semiconductor wafer such as the semiconductor wafer 100. At 202, the photoresist material 102 is developed. In one or more embodiments, the photoresist 102 is developed at room temperature, i.e. between 15° C. and 25° C. At 204, the semiconductor wafer with developed photoresist is introduced into a controlled cold temperature environment. At 206, the semiconductor wafer with developed photoresist is maintained in the controlled temperature environment until inelastic thermal contraction of the developed photoresist material results in reducing the critical dimension (CD) of the mask. In one or more embodiments, the wafer with developed photoresist is maintained in the controlled cold temperature environment for a duration of not less than 60 seconds and not more than 48 hours. At 208, the semiconductor with developed photoresist is removed from the controlled cold temperature environment.

Experimental results were obtained for a photoresist material EUVJ-3030 (manufactured by JSR) with 40 nanometer (nm) film thickness. A control wafer was processed without treatment after lithography, resulting in LER of about 4.83 nm and LWR of about 2.98 nm, as measured using Hitachi Terminal PC off-line software. A first wafer was treated with liquid nitrogen immersion until it reached thermal equilibrium, less than one minute, resulting in LER of about 3.15 nm and LWR of about 2.94 nm, measured as above. A second wafer was treated for one day in a chiller compartment maintained about −6° C., resulting in LER of about 2.11 nm and LWR of about 2.13 nm, measured as above. Overall, the brief liquid nitrogen immersion produced improvements of 1.68 nm or 35% in LER and 0.04 nm or 1.3% in LWR. The prolonged exposure in the chiller compartment produced improvements of 2.72 nm or 56% in LER and 0.85 nm or 29% in LWR.

In one or more embodiments, it is considered sufficient to maintain the semiconductor wafer in the controlled cold temperature environment until the LER of the developed photoresist improves by at least 10% compared to the LER of similarly developed photoresist that has not been exposed to the controlled cold temperature environment.

Figure 3:
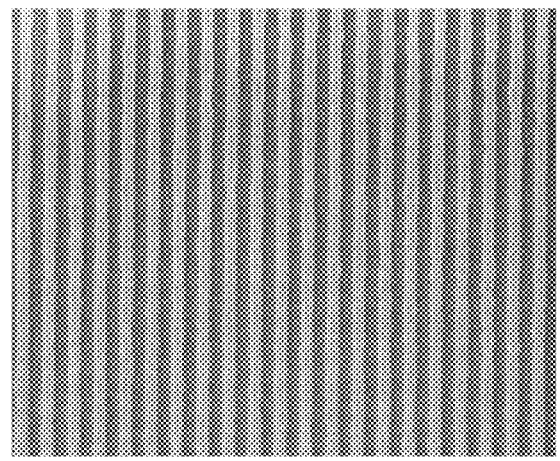
FIG. 3 depicts an SEM image of line edge roughness on a semiconductor wafer post lithography without treatment according to an exemplary embodiment.
Figure 4:
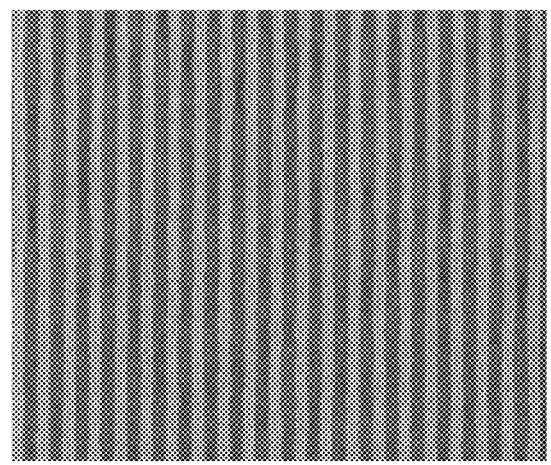
FIG. 4 depicts an SEM image of line edge roughness on a semiconductor wafer post lithography with treatment according to an exemplary embodiment.
Figure 5:
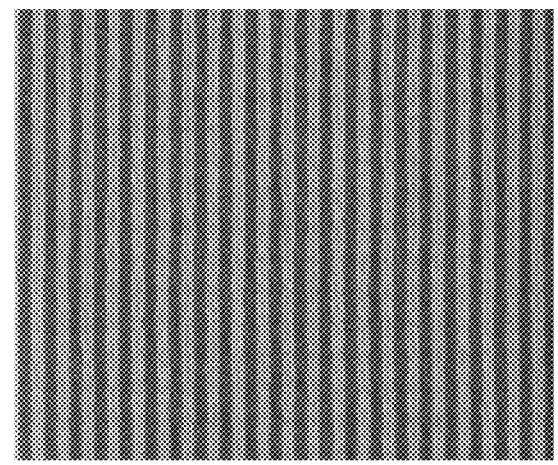
FIG. 5 depicts an SEM image of line edge roughness on a semiconductor wafer post lithography with treatment according to another exemplary embodiment.
Figure 6:
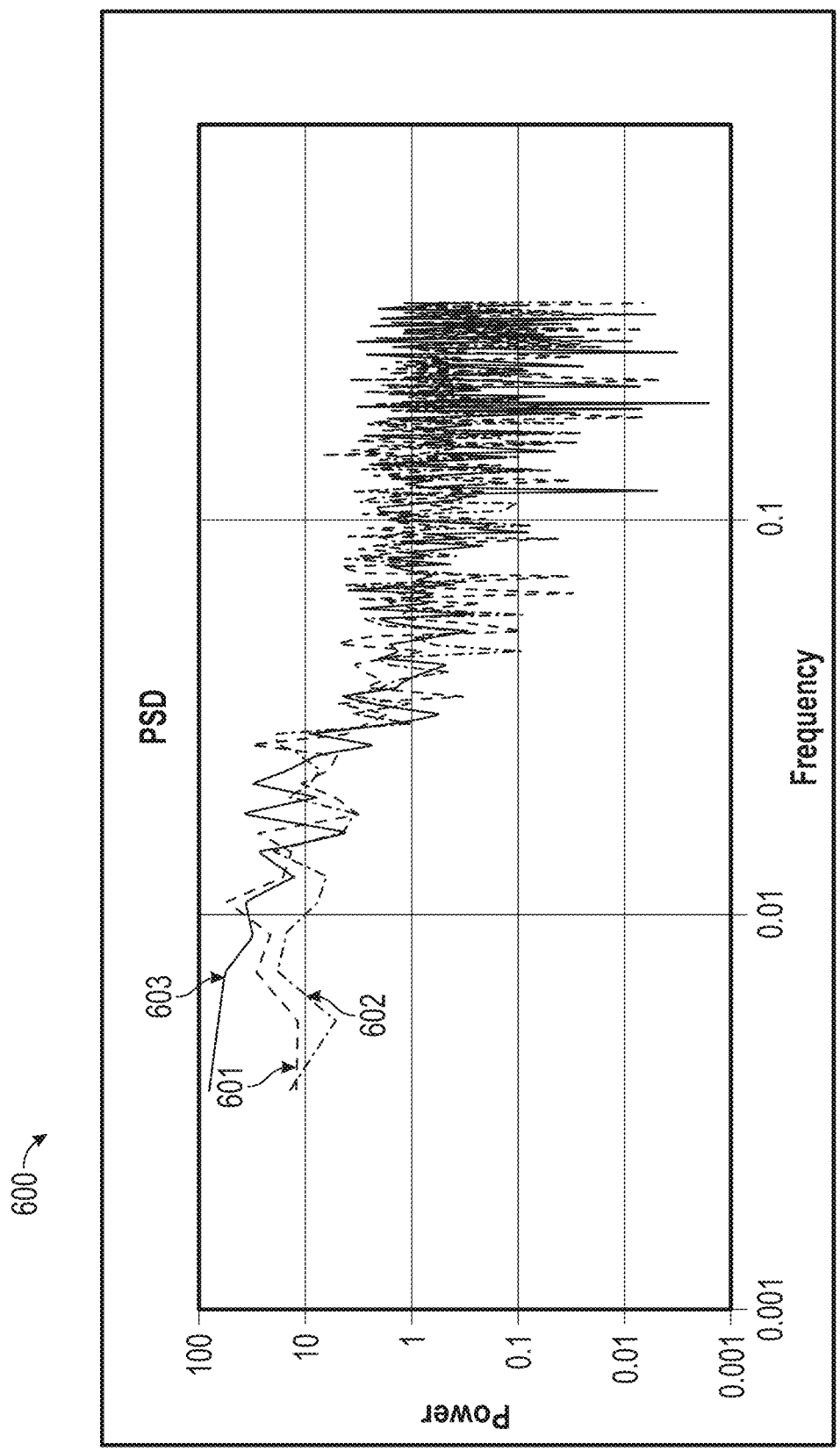
FIG. 6 depicts a power spectral density (PSD) graph of line edge roughness measurements for each of the wafers shown in FIGS. 3-5.

FIG. 3 depicts in an SEM image the LER and LWR of the untreated control wafer. FIG. 4 depicts in an SEM image the LER and LWR of the first wafer treated with liquid nitrogen. FIG. 5 depicts in an SEM image the LER and LWR of the second wafer treated in the chiller compartment. FIG. 6 depicts a power spectral density (PSD) graph 600 of line edge roughness measurements for each of the three wafers shown in FIGS. 3-5. Note that the PSD graph shows improved values of line edge roughness, in a low frequency range, for the first wafer (curve 601) and for the second wafer (curve 602) compared to the control wafer (curve 603).

Figure 7:
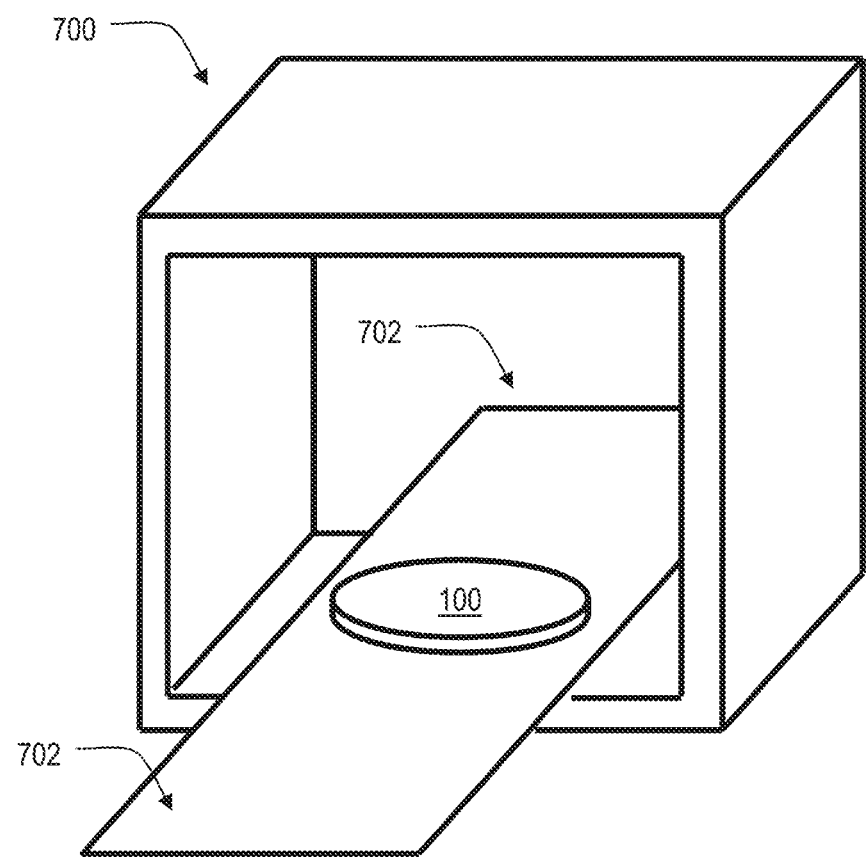
FIG. 7 depicts a semiconductor wafer in a chiller chamber on a clean track, according to an exemplary embodiment.

FIG. 7 depicts the semiconductor wafer 100 disposed in a chiller chamber 700. In one or more embodiments, the chiller chamber 700 is configured as a module on a clean track 702. In other embodiments, the chiller chamber 700 may be configured as a standalone module also used for wafer storage.

Given the discussion thus far, it will be appreciated that, in general terms, an exemplary method, according to an aspect of the invention, includes developing a photoresist on a semiconductor wafer; introducing the semiconductor wafer into a controlled cold temperature environment; maintaining the semiconductor wafer in the controlled cold temperature environment until inelastic thermal contraction of the developed photoresist material results in reducing the critical dimension (CD) of the photoresist by not less than 10% from its value before exposure to the controlled cold temperature environment; and removing the semiconductor wafer from the controlled cold temperature environment.

In one or more embodiments, the method also includes warming the semiconductor wafer to room temperature. In one or more embodiments, the controlled cold temperature environment is at a temperature of at least −196° C. and not more than 5° C. In one or more embodiments, the controlled cold temperature environment is within a temperature range −78° C. to 5° C. In one or more embodiments, the semiconductor wafer with the developed photoresist is maintained in the controlled cold temperature environment until inelastic thermal contraction of the developed photoresist material results in reducing the critical dimension (CD) of the photoresist. In one or more embodiments, the semiconductor wafer is maintained in the controlled cold temperature environment for at least 60 seconds and not more than 48 hours. In one or more embodiments, the semiconductor wafer is maintained in the controlled cold temperature environment for not more than five minutes. In one or more embodiments, the semiconductor wafer is maintained in the controlled cold temperature environment for at least one hour.

According to another aspect, on a semiconductor wafer that has been treated with developed photoresist and that has been exposed to a controlled cold temperature environment, the developed photoresist has line edge roughness and line width roughness that are at least 10% less than the corresponding critical dimensions of a semiconductor wafer with the same composition of photoresist developed in the same way that has not been exposed to a controlled cold temperature environment.

In one or more embodiments, the developed photoresist has line edge roughness less than 4 nanometers (nm) and line width roughness less than 3 nm. In one or more embodiments, the line edge roughness is less than 3 nm. In one or more embodiments, the line width roughness is less than 2.5 nm. In one or more embodiments, the developed photoresist has been maintained in the controlled cold temperature environment for at least 60 seconds and not more than 48 hours. In one or more embodiments, the controlled cold temperature environment was maintained between −196° C. and 5° C.

According to another aspect, an exemplary apparatus includes a semiconductor wafer that is patterned with a developed photoresist, and a chiller chamber that is maintained at a controlled cold temperature between −78° C. and 5° C. The semiconductor wafer is disposed within the chiller chamber. In one or more embodiments, the controlled cold temperature is not more than 0° C. In one or more embodiments, the chiller chamber may be a module on a clean track. In one or more embodiments, the chiller chamber may be a standalone module also used for wafer storage.

In one or more embodiments, the wafer is exposed to the controlled cold temperature environment, as described above, after exposing and developing the photoresist and before etching the wafer. The wafer can be exposed to the controlled cold temperature environment at any layer, i.e. at FEOL or BEOL or anywhere in between. The wafer can be exposed repeatedly to the controlled cold temperature environment as desired to improve the LER and LWR of multiple layers. In one or more embodiments, the photoresist is developed at room temperature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    developing a photoresist that has been deposited on a semiconductor wafer, the developing being carried out at room temperature of between 15 and 25 degrees Celsius on the semiconductor wafer, the developing resulting in photoresist features of the developed photoresist, the photoresist features having an initial line edge roughness (LER);
    after developing the photoresist, introducing the semiconductor wafer with the developed photoresist thereon into a controlled cold temperature environment by submerging the semiconductor wafer in liquid nitrogen;
    maintaining the semiconductor wafer in the liquid nitrogen at least until thermal equilibrium is achieved at a temperature of no greater than −196° C. and at least until inelastic thermal contraction of the developed photoresist material caused by the immersion in the liquid nitrogen results in reducing the initial line edge roughness (LER) of the photoresist features by not less than 10% from the initial line edge roughness (LER) before exposure to the liquid nitrogen;
    removing the semiconductor wafer from the liquid nitrogen to a room temperature environment after the reduction in the initial line edge roughness (LER) is achieved; and
    after removing the semiconductor wafer from the liquid nitrogen and after the wafer reaches room temperature, etching the semiconductor wafer using the photoresist with the reduced line edge roughness (LER).

2. The method of claim 1, wherein the immersion in the liquid nitrogen is maintained until the initial line edge roughness (LER) of the photoresist features is reduced by not less than 35% from the initial line edge roughness (LER) before exposure to the liquid nitrogen.

3. The method of claim 2, wherein, in the developing step, the initial line edge roughness (LER) of the photoresist features is about 4.83 nm, and wherein the immersion in the liquid nitrogen is maintained until the initial line edge roughness (LER) of the photoresist features is reduced to about 3.15 nm.

* * * * *